United States Patent [19]
Young

[11] Patent Number: 5,382,903
[45] Date of Patent: Jan. 17, 1995

[54] MAGNETIC RESONANCE APPARATUS

[75] Inventor: Ian R. Young, Nr. Marlborough, England

[73] Assignee: Picker International, Inc., Cleveland, Ohio

[21] Appl. No.: 56,751

[22] Filed: May 4, 1993

[30] Foreign Application Priority Data

May 5, 1992 [GB] United Kingdom ............... 9209625

[51] Int. Cl.⁶ .......................................... G01R 33/20
[52] U.S. Cl. .................................................. 324/318
[58] Field of Search ............... 324/300, 307, 309, 318, 324/322; 333/26

[56] References Cited

U.S. PATENT DOCUMENTS

| | | | |
|---|---|---|---|
| 4,636,730 | 1/1987 | Bottomley | 324/322 |
| 4,714,887 | 12/1987 | Meissner et al. | 324/322 |
| 4,839,595 | 6/1989 | Boskamp | 324/318 |
| 4,926,125 | 5/1990 | Roemer | 324/318 |
| 5,091,708 | 2/1992 | Bezjak | 333/26 |
| 5,196,796 | 3/1993 | Misic et al. | 324/322 |
| 5,280,248 | 1/1994 | Zou et al. | 324/318 |

FOREIGN PATENT DOCUMENTS

| | | |
|---|---|---|
| 0180121 | 5/1986 | European Pat. Off. . |
| 1306207 | 2/1973 | United Kingdom . |
| 2162641 | 2/1986 | United Kingdom . |

Primary Examiner—Michael J. Tokar
Attorney, Agent, or Firm—Timothy B. Gurin; Randall A. Notzen

[57] ABSTRACT

A radio frequency signal detector coil arrangement (17) for a magnetic resonance apparatus comprising a planar coil (25) and an annular magnetic flux rejecting arrangement (25) disposed coaxially with the planar coil, on one side thereof, which reduces the sensitivity of the planar coil to signals from sources remote from the axis of the planar coil. One embodiment of the flux reducing arrangement comprises an annular superconducting member (35) disposed between the planar coil and the body (31). In other embodiments it comprises an arrangement of coils which conform to a tubular surface coaxial with the planar coil, and electrically connected therewith.

14 Claims, 2 Drawing Sheets

MAGNETIC RESONANCE APPARATUS

This invention relates to magnetic resonance methods and apparatus.

More especially the invention relates to radio frequency (r.f.) coils for use in such methods and apparatus.

In magnetic resonance methods and apparatus a static magnetic field is applied to the body under investigation to define an equilibrium axis of magnetic alignment in the region of the body being examined. An r.f. field is then applied to the region being examined in a direction orthogonal to the static magnetic field direction, to excite magnetic resonance in the region, and resulting r.f. signals are detected and processed.

The exciting r.f. field is applied and resulting signals are detected by r.f. coil arrangements placed adjacent the body. Normally separate coils are used for excitation and detection but the same coil or coils are sometimes used for both purposes.

Where the apparatus is intended for use in examining an internal region of a patient for medical purposes, e.g. to obtain an image and/or spectroscopic data of the internal region, an r.f. receiver coil arrangement in the form of a planar coil adapted to be placed on or closely adjacent the surface of the patient's body, adjacent the region to be investigated, is frequently used.

Such a receiver coil arrangement suffers from the disadvantage that, especially where the internal region to be investigated is small and/or relatively deep inside the patient's body, the signal picked up by the coil arrangement which originates in the region under investigation may be reduced compared with noise signals picked up by the coil which originate elsewhere in the body. This arises, of course, because the coil arrangement is sensitive to signals in a volume of the body which is larger than the region under investigation.

It is an object of the present invention to provide an r.f. coil arrangement for use in a magnetic resonance apparatus whereby this problem may be alleviated.

According to a first aspect of the invention there is provided a coil arrangement suitable for use as an r.f. receiver coil arrangement in a magnetic resonance apparatus comprising: a substantially planar coil and a generally annular magnetic flux rejecting arrangement disposed coaxially with the coil on one side thereof whereby the sensitivity of the planar coil to signals from sources remote from the axis of the coil is decreased.

In one particular embodiment of the invention the flux rejecting arrangement comprises an annular member of superconducting material. In such an arrangement the annular member suitably comprises a layer of superconducting material on a surface of a tubular member of electrically insulating material.

In another embodiment of the invention the flux rejecting arrangement comprises a tubular coil arrangement comprising at least one further coil connected with said planar coil so that flux coupled with both said planar coil and said further coil produces a resultant signal across the connection of the two coils which is smaller than the signal produced across the planar coil alone.

According to a second aspect of the invention there is provided a magnetic resonance apparatus comprising: means for generating a static magnetic field to define an equilibrium axis of magnetic alignment in a region in which a body to be examined is positioned in use of the apparatus; and an r.f. coil arrangement according to the present invention, the coil arrangement being positioned with the planar coil adjacent said region with its axis substantially orthogonal to the direction of said static magnetic field and aligned with a location in said region occupied by a part of the body to be investigated in use of the apparatus.

Where the coil arrangement is of the kind including an annular member of superconducting material, the coil arrangement is positioned so that the annular member of superconducting material lies between the planar coil and said region.

According to a third aspect of the invention there is provided a method of examining a region of a body using a magnetic resonance technique comprising: disposing said region of the body in a static magnetic field; exciting magnetic resonance in said region; and detecting radio frequency signals arising from said region by means of at least one coil arrangement according to the present invention positioned alongside said region with the axis of the planar coil of said coil arrangement substantially orthogonal to the direction of said static magnetic field.

Several r.f. coil arrangements and methods and apparatus in accordance with the invention will now be described by way of example with reference to the accompanying drawings in which.

Figure 1:
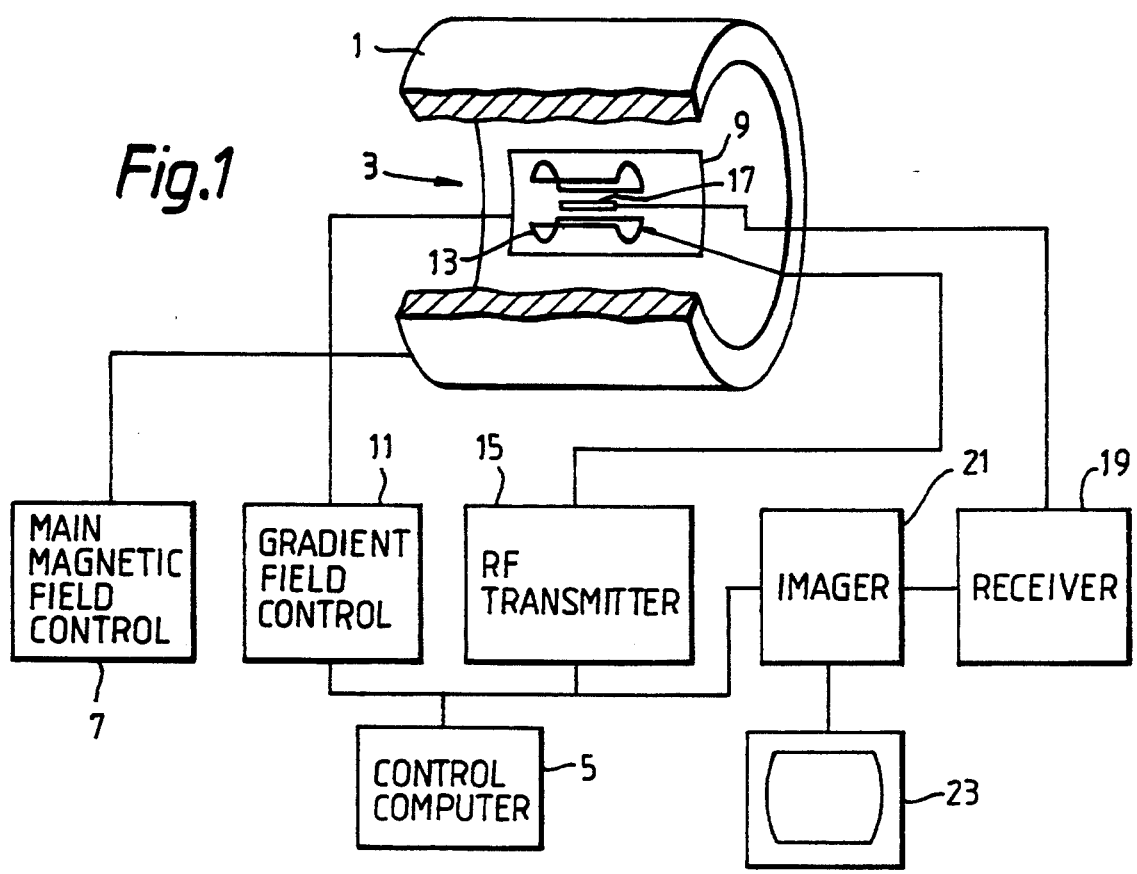
FIG. 1 is a schematic diagram of the apparatus.

Referring to FIG. 1, the apparatus, which is a magnetic resonance imaging apparatus, includes a tubular electromagnet 1 which produces a strong uniform static main axial magnetic field in a cylindrical volume 3 in which a body to be imaged is placed in use of the apparatus.

The strength of the field in the volume 3, and hence in the body being imaged, is controlled by a main magnet control means 7 which controls the supply of energising current to the electromagnetic energising coil (not shown).

The apparatus further includes a gradient coil arrangement 9 whereby a gradient magnetic field may be imposed on the static magnetic field in the volume 3 in a direction parallel to the static field with a gradient in any one or more of three orthogonal directions. The coil arrangement 9 is energised by a gradient field control means 11 under control of a computer 5.

The apparatus further includes an r.f. coil system 13 energised by an r.f. transmitter 15 under control of the computer 5 to apply an r.f. field to the body being imaged.

An r.f. receiver coil arrangement 17 is arranged to detect r.f. signals resulting from magnetic resonance excited in the body being imaged. The detected signals are passed via a receiver 19 to an imager 21 which under control of the computer 5 processes the signals to produce signals representing an image of the body. These signals are, in turn, passed to a display device 23 to provide a visual display of the image.

In operation of the apparatus the strong magnetic field provided by the electromagnet 1 defines an equilibrium axis of magnetic alignment in the body being imaged.

To obtain an image of a selected region, e.g. a cross-sectional slice of the body, an r.f. field pulse is first applied to the body by means of the coil system 13 to excite magnetic resonance in the selected region. To this end the coil system 13 produces a field in a direction orthogonal to the static field direction so as to tip the spins of nuclei in the selected region from the direction of the static field into a plane orthogonal to the static field direction. To restrict excitation to the selected region the r.f. field pulse is applied in conjunction with magnetic field gradients imposed by the coil arrangement 9, the frequency of the r.f. field being chosen in conjunction with the magnitudes and directions of the imposed gradients so that the Larmor frequency of chosen protons in the body, e.g. hydrogen protons, is equal to the r.f. field frequency only in the selected region.

The r.f. signals resulting from excitation are then spatially encoded by application of one or more further gradient magnetic fields in known manner, detected by the r.f. coil arrangement 17, and processed to produce an image.

Normally a number of excitation and signal detection sequences are required to produce sufficient data to produce a satisfactory image.

It will be appreciated that the foregoing description of operation merely illustrates one basic mode of operation, and that the apparatus can be used to obtain data regarding a subject of interest in many different known modes, each involving application of different sequences of r.f. pulses and magnetic field gradients.

The r.f. receiving coil arrangement 17 is positioned in use of the apparatus adjacent to a part of the surface of the body close to the region to be examined.

Figure 2:
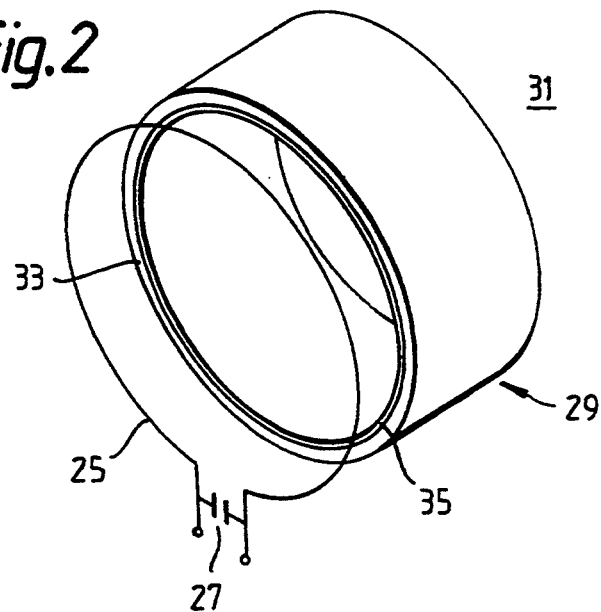
FIG. 2 is a diagrammatic perspective view of one embodiment of an r.f. coil arrangement of the apparatus.

Referring to FIG. 2, in one embodiment of the invention the coil arrangement 17 comprises a planar circular superconducting coil 25, shown in FIG. 2 as having a single turn only for simplicity, and tuned by a capacitance 27. The coil arrangement further includes a tubular member 29 of superconducting material, positioned coaxially with the coil 25, between the coil 25 and the body being examined 31. The member 29 suitably comprises a tubular member of electrically insulating ceramic material 33, such as zirconia, with a coating of yttrium, barium, copper oxide superconducting material 35 on one of its curved surfaces, the inner surface in FIG. 2.

In use, the coil 25, and hence the member 29 also, is disposed with its axis orthogonal to the direction of the main field in the volume 3 and aligned with the region of the body 31 to be examined, i.e. so that its axis passes substantially through the centre of the region. Due to the presence of the member 29, the sensitive region of the coil 25, i.e. the region from which r.f. signals must originate to produce a signal voltage between the ends of the coil 25, lies predominantly along the axis of the coil 25. This arises because flux changes occurring within the member 29 except those occurring on the axis of the member 29 induce currents in the member which oppose such changes. Thus noise sources, more particularly those in the body 31 being examined, which do not lie on or near the axis of the coil 25 do not contribute to noise voltage in the coil output signal, although of course noise source along or near the axis do.

To further improve signal-to-noise ratio, two or more coil arrangements as shown in FIG. 2 may be arranged so that the axes of the planar coils of the arrangements intersect in the region to be examined. The signals from the different coil arrangements are added together, after appropriate correction for phase differences, e.g. due to differences in the spacings of the different coils from the intersection point. The desired signals and noise from the intersection region will then add coherently, but noise from other regions along the coil axes will be incoherent and not contribute significantly to noise component in the output signal.

Figure 3:
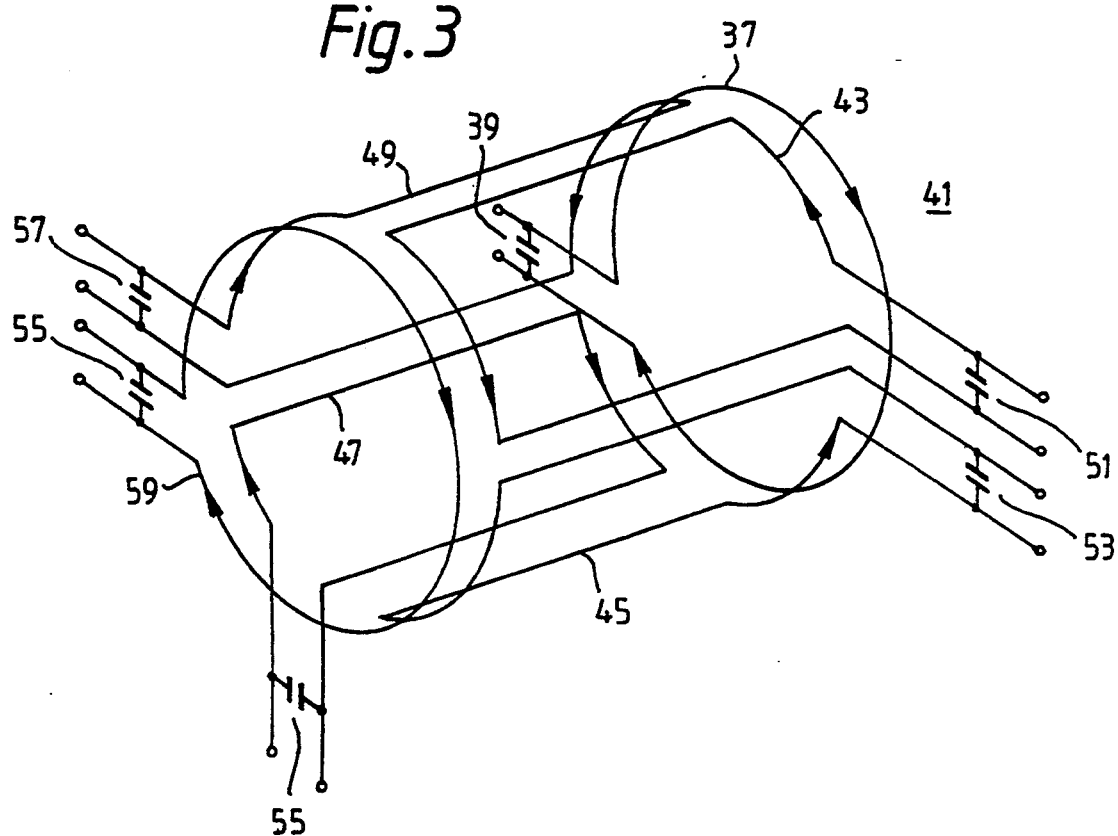
FIG. 3 is a diagrammatic perspective view of a first alternative form for the r.f. coil arrangement.

Referring now to FIG. 3 in a second embodiment of the invention the coil arrangement 17 comprises a planar circular superconducting coil 37, tuned by a capacitance 39, positioned with its axis orthogonal to the direction of the main field in the volume 3 and aligned with the region of the body 41 to be examined. The coil arrangement further includes four identical rectangular saddle-shaped superconducting arcuate coils 43, 45, 47 and 49 each tuned by a respective capacitance 51, 53, 55 or 57. The coils 41, 43, 45 and 47 are supported on a tubular former (not shown) coaxial with the coil 37, on the side of the coil remote from the body 41, each coil 43, 45, 47 or 49 subtending an angle of just under 90° at the axis of the former. The coils are connected in series between a pair of output terminals (not shown) in senses such that flux arising from excitation of spins in the body 41 which is coupled both to the coil 37 and a coil 43, 45, 47 or 49 produces between the output terminals by virtue of the coupling to coil 37 a voltage which opposes the voltage produced between the output terminals by virtue of the coupling to coil 43, 45, 47 or 49, as indicated by the arrows in FIG. 3. Thus, only flux coupled to the coil 37 only and not also coupled with a coil 43, 45, 47 or 49 produces a significant resultant voltage at the output terminals. Flux coupled with any two of coils 43, 45, 47 and 49 will also produce opposed voltages and hence not produce a signal at the output terminals, but flux coupled with a single one of the coils 43, 45, 47 and 49 will produce such a signal. However, in practice, due to their orientation with respect to the direction of the static field in volume 3, the coils 43, 45, 47 and 49 are very inefficiently coupled to flux arising from excitation of spins in the body 41. As a result, the signal at the output terminals of the series connection of coils results in the main from flux arising from sources substantially aligned with the axis of the coil 37, i.e. sources in the region of the body 41 under examination, since only such flux couples only with the coil 37. Thus the output signal of the arrangement contains only a small noise component from parts of the body 41 outside the region of interest.

This effect can be enhanced by providing a further planar circular superconducting tuned coil 59 coaxial with the coil 37 at the other ends of the coils 43, 45, 47 and 49 series connected with the other coils between the output terminals of the series connection. It should be noted that flux coupled with coil 59 and any one of coils 43, 45, 47, 49 induces voltages which are additive and thus produces a resultant signal at the output terminals, thereby reducing the desired signal, i.e. the signal due to flux coupled only with coils 37 and 59 and not with any of coils 43, 45, 47 and 49. However, this effect can be reduced by increasing the spacing between coil 59 and coils 43, 45, 47 and 49, although only at the expense of some loss of desired flux coupled with coil 59.

Figure 4:
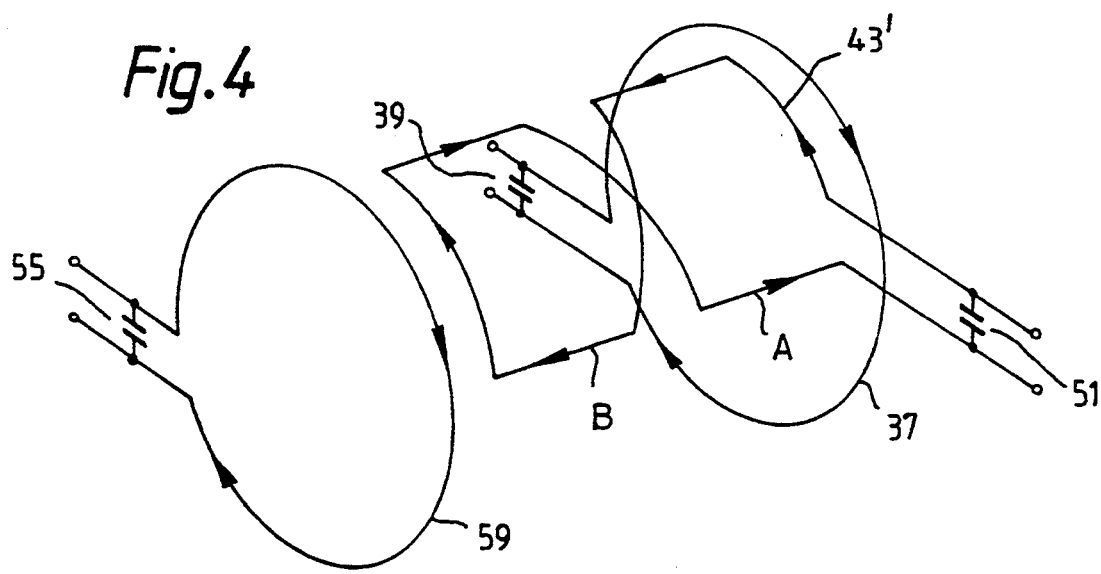
FIG. 4 is a diagrammatic perspective view of a second alternative form for the r.f. coil arrangement.

Referring now to FIG. 4, in a modification of the coil arrangement of FIG. 3, to give a measure of rejection of undesired signal resulting from flux coupled with coil 59 and a coil 43, 45, 47 or 49, the coils 43, 45, 47 and 49 may each be wound with a central cross-over, as shown in FIG. 4 at 43', for coil 43 only for simplicity. It will be seen that with this arrangement that rejection is obtained for flux coupled with coil 37 and the nearer part A of coil 43', and flux coupled with coil 59 and the nearer part B of coil 43'. However, rejection is not obtained for flux coupled with coil 37 and part B of coil 43' and for flux coupled with coil 59 and part A of coil 43'.

It will be understood that whilst four quadrant coils are used in the arrangements of FIGS. 3 and 4 more or fewer coils may be used in other arrangements.

It will be appreciated that two or more coils arrangements as shown in FIG. 3 or FIG. 4, with their axes differently angularly aligned with the region of interest may be used, as described above in relation to the arrangement of FIG. 2.

It will be understood that whilst superconducting coils are used in the receive r.f. coil arrangements described above, by way of example, with consequent reduction of internal Johnson noise, this is not necessary in an arrangement according to the invention.

I claim:

1. A magnetic resonance apparatus radio frequency receiver coil comprising:
   a substantially planar radio frequency sensitive coil having an axis disposed substantially perpendicular to the plane thereof; and
   a generally annular magnetic flux rejecting means disposed coaxially with the planar coil axis on one side of the plane of said planar coil whereby the sensitivity of the planar coil to radio frequency signals emanating from a source remote from the axis of the coil is decreased.

2. The receiver coil according to claim 1 wherein said flux rejecting means comprises an annular member of superconducting material.

3. The receiver coil according to claim 2 wherein said annular member comprises a layer of superconducting material on a surface of a tubular member of electrically insulating material.

4. The receiver coil according to claim 1 wherein said flux rejecting means comprises a tubular coil means comprising at least one further coil connected with said planar coil so that flux coupled with both said planar coil and said further coil produces a resultant signal across the connection of the two coils which is smaller than the signal produced across the planar coil alone.

5. The receiver coil according to claim 4 wherein said tubular coil means comprises a plurality of substantially identical arcuate coils.

6. The receiver coil according to claim 5 wherein said tubular coil means comprises four coils.

7. The receiver coil according to claim 4 including a further planar coil coaxial with said first-mentioned planar coil at the end of said tubular coil means remote from said first-mentioned planar coil.

8. The receiver coil according to claim 7 wherein each coil of said tubular coil means has a cross-over.

9. The receiver coil according to claim 4 wherein said planar coil and said tubular coil means are connected in series.

10. A magnetic resonance apparatus comprising:
    means for generating a static magnetic field to define an equilibrium axis of magnetic alignment in a region in which a body to be examined is positioned in use of the apparatus; and
    an r.f. receiver coil, comprising:
      a substantially planar radio frequency sensitive coil having an axis disposed substantially perpendicular to the plane of said planar coil; and
      a generally annular magnetic flux rejecting means disposed coaxially with the planar coil axis on one side of the plane of said planar coil whereby the sensitivity of the planar coil to r.f. signals emanating from a source remote from the axis of the coil is decreased, the r.f. receiver coil being positioned with the planar coil adjacent said region with its axis substantially orthogonal to the direction of said static magnetic field and aligned with a location in said region occupied by a part of the body to be investigated in use of the apparatus.

11. An apparatus according to claim 10 wherein said flux rejecting means comprises an annular member of superconducting material positioned between the planar coil and said region.

12. An apparatus according to claim 10 wherein said flux rejecting means comprises a tubular coil means comprising at least one further coil connected with said planar coil so that flux coupled with both said planar coil and said further coil produces a resultant signal across the connection of the two coils which is smaller than the signal produced across the planar coil alone.

13. A method of examining a region of a body using a magnetic resonance technique comprising:
    disposing said region of the body in a static magnetic field;
    exciting magnetic resonance in said region: and
    detecting radio frequency signals arising from said region by means of at least one coil means positioned alongside said region and comprising:
      a substantially planar radio frequency sensitive coil having an axis disposed substantially perpendicular to the plane thereof; and
      a generally annular magnetic flux rejecting means disposed coaxially with the planar coil axis on one side of the plane of said planar coil whereby the sensitivity of the planar coil to radio frequency signals emanating from a source remote from the axis of the coil is decreased.

14. A method according to claim 13 wherein at least two said coil means are used, the axes of the planar coils of said at least two coil means being angled with respect to one another so as to intersect at a common location in said region.

* * * * *